US011510320B2

(12) United States Patent
Sato et al.

(10) Patent No.: US 11,510,320 B2
(45) Date of Patent: Nov. 22, 2022

(54) METHOD OF PROCESSING WIRING SUBSTRATE

(71) Applicant: ULVAC, INC., Chigasaki (JP)

(72) Inventors: Muneyuki Sato, Chigasaki (JP); Yasuhiro Morikawa, Chigasaki (JP); Minoru Suzuki, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 734 days.

(21) Appl. No.: 16/313,847

(22) PCT Filed: Nov. 30, 2017

(86) PCT No.: PCT/JP2017/043062
§ 371 (c)(1),
(2) Date: Dec. 27, 2018

(87) PCT Pub. No.: WO2018/101404
PCT Pub. Date: Jun. 7, 2018

(65) Prior Publication Data
US 2020/0315021 A1    Oct. 1, 2020

(30) Foreign Application Priority Data

Dec. 2, 2016    (JP) .............................. JP2016-235054

(51) Int. Cl.
H05K 3/00    (2006.01)
H05K 3/46    (2006.01)

(52) U.S. Cl.
CPC .......... H05K 3/0041 (2013.01); H05K 3/467 (2013.01); H05K 2203/095 (2013.01)

(58) Field of Classification Search
CPC .......... H05K 3/26; H05K 3/46; H05K 1/0353; H05K 1/0366; H05K 1/0373; H05K 3/41;
(Continued)

(56) References Cited

U.S. PATENT DOCUMENTS 6,150,074 A    11/2000  Shimoto et al.
2002/0024354 A1  2/2002  Pietzschmann
(Continued)

FOREIGN PATENT DOCUMENTS

CN    1653012     8/2005
CN    101523297   9/2009
(Continued)

OTHER PUBLICATIONS

International Search Report from corresponding PCT Application No. PCT/JP2017/043062 dated Mar. 6, 2018 English translation attached.
(Continued)

Primary Examiner — Tabassom Tadayyon Eslami
(74) Attorney, Agent, or Firm — Grossman, Tucker, Perreault & Pfleger, PLLC

(57) ABSTRACT

A method of the invention is a method of processing a wiring substrate that includes a configuration in which conductors locally disposed on a substrate are coated with resin having inorganic members that form a filler and are dispersed in an organic member, the method including: removing the organic member from a surface layer side of the resin by use of an ashing method; and removing, by use of a wet cleaning method, the inorganic members remaining the surface layer side of the resin from which the organic member is removed.

6 Claims, 12 Drawing Sheets

(58) Field of Classification Search
CPC ......... H05K 1/0393; H05K 2203/0763; H05K 3/0041; H01F 41/04
USPC ........................................................ 427/96.1
See application file for complete search history.

(56) References Cited

U.S. PATENT DOCUMENTS

| | | | |
|---|---|---|---|
| 2005/0109533 A1* | 5/2005 | Kurashina | H05K 3/28 174/258 |
| 2005/0130414 A1* | 6/2005 | Choi | H01L 45/126 438/597 |
| 2008/0041615 A1* | 2/2008 | Zhong | H05K 3/285 174/255 |
| 2008/0242081 A1 | 10/2008 | Idani | |
| 2009/0229872 A1* | 9/2009 | Takai | H05K 1/023 29/829 |
| 2009/0236693 A1 | 9/2009 | Moustakas et al. | |
| 2009/0280583 A1 | 11/2009 | Hirasawa et al. | |
| 2010/0024983 A1* | 2/2010 | Honda | H01L 21/31138 156/345.46 |
| 2012/0018194 A1* | 1/2012 | Maeda | H05K 3/0035 174/251 |

FOREIGN PATENT DOCUMENTS

| | | |
|---|---|---|
| CN | 101825802 | 9/2010 |
| CN | 102242025 | 11/2011 |
| JP | 05-007079 | 1/1993 |
| JP | 09-241419 | 9/1997 |
| JP | 2006-237603 | 9/2006 |
| JP | 2009-224616 | 10/2009 |
| JP | 2010-001543 * | 1/2010 |
| JP | 2010-251162 | 11/2010 |
| JP | 2012-004505 | 1/2012 |
| JP | 2012-044158 | 3/2012 |
| JP | 2013-168613 | 8/2013 |
| TW | 201634756 | 10/2016 |
| WO | 2012/042846 | 4/2012 |

OTHER PUBLICATIONS

Office Action from related Japanese Application No. 2018-554242 dated Oct. 8, 2019 English translation attached.
Office Action from related Chinese Application No. 201780040084.3, dated Sep. 18, 2020. English translation of Search Report only.
Office Action from related Japanese Application No. 2018-554242 dated Jul. 23, 2019. English translation attached.
Office Action from related Taiwanese Application No. 106142165 dated Jul. 2, 2019. English translation attached.
Search Report from related EPO Application No. 17875378.6, dated Jun. 24, 2020.
First Office Action from related Chinese Application No. 2017800400843, dated Feb. 9, 2022. English translation attached. 6 pages.

* cited by examiner

METHOD OF PROCESSING WIRING SUBSTRATE

TECHNICAL FIELD

The present invention relates to a method of processing a wiring substrate that includes a configuration in which conductors locally disposed on a substrate are coated with resin having inorganic members that form a filler and are dispersed in an organic member, and the wiring substrate is preferably used for a multi-layer wiring substrate.

This application claims priority from Japanese Patent Application No. 2016-235054 filed on Dec. 2, 2016, the contents of which are incorporated herein by reference in their entirety.

BACKGROUND ART

As a method of processing a wiring substrate suitable to a multi-layer wiring substrate, for example, a method disclosed in Patent Document 1 or Patent Document 2 is known.

Patent Document 1 discloses a method of manufacturing a multi-layer wiring substrate by use of a ceramic wiring substrate as a base substrate. Particularly, paragraph 0078 of Patent Document 1 shows that, in the middle of a manufacturing process, there is a case where the foregoing multi-layer wiring substrate is covered with an insulating film and top surfaces of conductors are not exposed.

The above-mentioned situation is due to the reasons, such that a surface of a die cannot practically and completely be flat, a surface of a die is difficult to be completely brought into close contact with upper faces of wirings, heights of a wiring layer are difficult to be completely aligned with each other, or the like. Consequently, there is an explanation that the upper faces of the wirings are necessary to be exposed by removing a surface of an insulating film by a wet etching method, a dry etching method, a mechanical polishing method, or a method of combining the aforementioned methods. However, a specific solution is not disclosed in Patent Document 1.

Generally, the aforementioned insulating film does not have a simple structure made of a single member but is formed of resin having inorganic members that form a filler and are dispersed in an organic member. Therefore, as shown in FIG. 12, for example, in the case of sequentially removing the insulating film from a surface of the insulating film by carrying out dry etching, since the inorganic members and the organic member are etched together, the processed surface becomes a rough surface.

That is, in a state where the surface of the wiring layer is exposed, the surface of the wiring layer is not flatly exposed, residues (inorganic members or organic member) of the insulating film randomly remain on the surface of the wiring layer, and furthermore the surface of the wiring layer is in a state of being rough. For this reason, in the case where a coating is formed on the exposed wiring layer, the surface of the coating stacked on the wiring layer is also in a state of being rough. Therefore, in the case of manufacturing a multi-layer wiring substrate, since it is necessary to repeat the above-described steps at various times, the closer to the upper layer of the multilayer wiring structure the wiring layer is located, the less flat of the coating surface of the wiring layer is.

Patent Document 2 discloses a method of electroless plating a wiring layer. A first wiring layer and a solder resist layer in which acid soluble filler and acid insoluble filler which are made of an inorganic substance are mixed are provided on an insulating substrate in this order, the surface of the solder resist layer is subjected to plasma ashing and the both fillers thereby remain, and the surface of the solder resist layer is selectively removed. Thereafter, the acid soluble filler exposed from the surface of the solder resist layer is dissolved, the surface of the solder resist layer is subjected to roughening, and then a second wiring layer is electroless-plated using metal on the solder resist layer.

Consequently, according to the description of Patent Document 2, in the manufacturing method thereof, since a plurality of recesses are formed on the surface of the solder resist layer, the adhesion strength of the second wiring layer provided thereon is improved. That is, Patent Document 2 has an object to rough the surface of the solder resist layer and discloses a reverse technique to a method of planarizing the surface of the solder resist layer.

Currently, in multi-layer wiring substrates, there is a tendency that the number of stacked layers increases more than ever in order to increase a degree of integration per unit area. Therefore, as described above, a problem is becoming obvious in that the closer to the upper layer of the multilayer wiring structure the wiring layer is located, the less flat of the coating surface of the wiring layer is, and therefore a method of solving this has been developed.

PRIOR ART DOCUMENTS

Patent Documents (Patent Document 1) Japanese Unexamined Patent Application, First Publication No. H09-241419
(Patent Document 2) Japanese Unexamined Patent Application, First Publication No. H05-007079

SUMMARY OF THE INVENTION

Problems to be Solved by the Invention

The invention was made in view of the above-described conventional situation, and has an object to provide a method of processing a wiring substrate which can carry out a process so that the surfaces of exposed conductors and the surface of the resin surrounding the conductors are on the same plane in order to manufacture a layered structure.

Means for Solving the Problems

A method of processing the wiring substrate according to an aspect of the invention is a method of processing a wiring substrate that includes a configuration in which conductors locally disposed on a substrate are coated with resin having inorganic members that form a filler and are dispersed in an organic member, the method includes: removing the organic member from a surface layer side of the resin by use of an ashing method (step A); and removing, by use of a wet cleaning method, the inorganic members remaining the surface layer side of the resin from which the organic member is removed (step B).

In the method of processing the wiring substrate according to the aspect of the invention, removal of the organic member from the surface layer side of the resin may be repeatedly carried out via the resin located at a position at which the conductors are covered therewith until surface layer portions of the conductors is observed.

In the method of processing the wiring substrate according to the aspect of the invention, an ashing method used in removal of the organic member from the surface layer side of the resin may be carried out while applying high-frequency power to the substrate, and a bias RF output (W) of the high-frequency power may be 0 to 1500.

In the method of processing the wiring substrate according to the aspect of the invention, an ashing method used in removal of the organic member from the surface layer side of the resin may be carried out while applying high-frequency power to the substrate, and a bias RF output density (W/cm$^2$) of the high-frequency power may be 0.2 to 0.8.

In the method of processing the wiring substrate according to the aspect of the invention, an ashing method used in removal of the organic member from the surface layer side of the resin may use, as a processing gas, a mixed gas containing a gas selected from the group consisting of oxygen ($O_2$), nitrogen ($N_2$), and carbon tetrafluoride ($CF_4$).

In the method of processing the wiring substrate according to the aspect of the invention, a seed layer may be formed which serves foundation used to form conductors in a layered structure so that at least part thereof overlaps conductors having a surface layer portion that is exposed due to removal of the inorganic members (step C), and whether or not surfaces of the exposed conductors and a surface of resin surrounding the conductors are on the same plane may be evaluated by measuring a surface profile of the seed layer (step D).

Effects of the Invention

An aspect of the invention is a method of processing a wiring substrate that includes a configuration in which conductors locally disposed on a substrate are coated with resin having inorganic members that form a filler and are dispersed in an organic member.

In the processing method according to the aspect of the invention, firstly, by removing the organic member from the surface layer side of the resin by use of an ashing method, the organic member is only removed while leaving inorganic members of the resin until reaching a desired depth. By carrying out the above-described removal of the organic member in multiple steps (a plurality of times), the removal of the organic member gradually proceeds until a state where the organic member is only removed is obtained at a deeper position of the resin. Subsequently, until a state where the organic member is only removed is obtained at the surfaces of the conductors locally disposed on the substrate, the removal of the organic member from the surface layer side of the resin (step A) is repeatedly carried out.

As a result, a state is obtained where organic member does not mostly remain in the resin located above the surfaces of the conductors and inorganic members forming a filler only remain. On the other hand, the resin located lower than the surfaces of the conductors is in a state of not being changed from before ashing is carried out, that is, a state is maintained where the inorganic members forming a filler are dispersed in the organic member.

Next, in the aspect of the invention, after the organic member is removed from the surface layer side of the resin by use of a wet cleaning method (after step A), the inorganic members that remain at the surface layer of the resin are removed. Therefore, the inorganic members that form a filler and remain in the resin located above the surfaces of the conductors are removed by wet cleaning. On the other hand, the resin located lower than the surfaces of the conductors is in an original state, that is, it is maintained in a state where the inorganic members forming a filler are dispersed in the organic member without being affected by wet cleaning.

Accordingly, the aspect of the invention contributes to provision of a method of processing a wiring substrate which can carry out a process so that the surfaces of exposed conductors and the surface of the resin surrounding the conductors are on the same plane in order to manufacture a layered structure.

EMBODIMENTS FOR CARRYING OUT THE INVENTION

Figure 1:
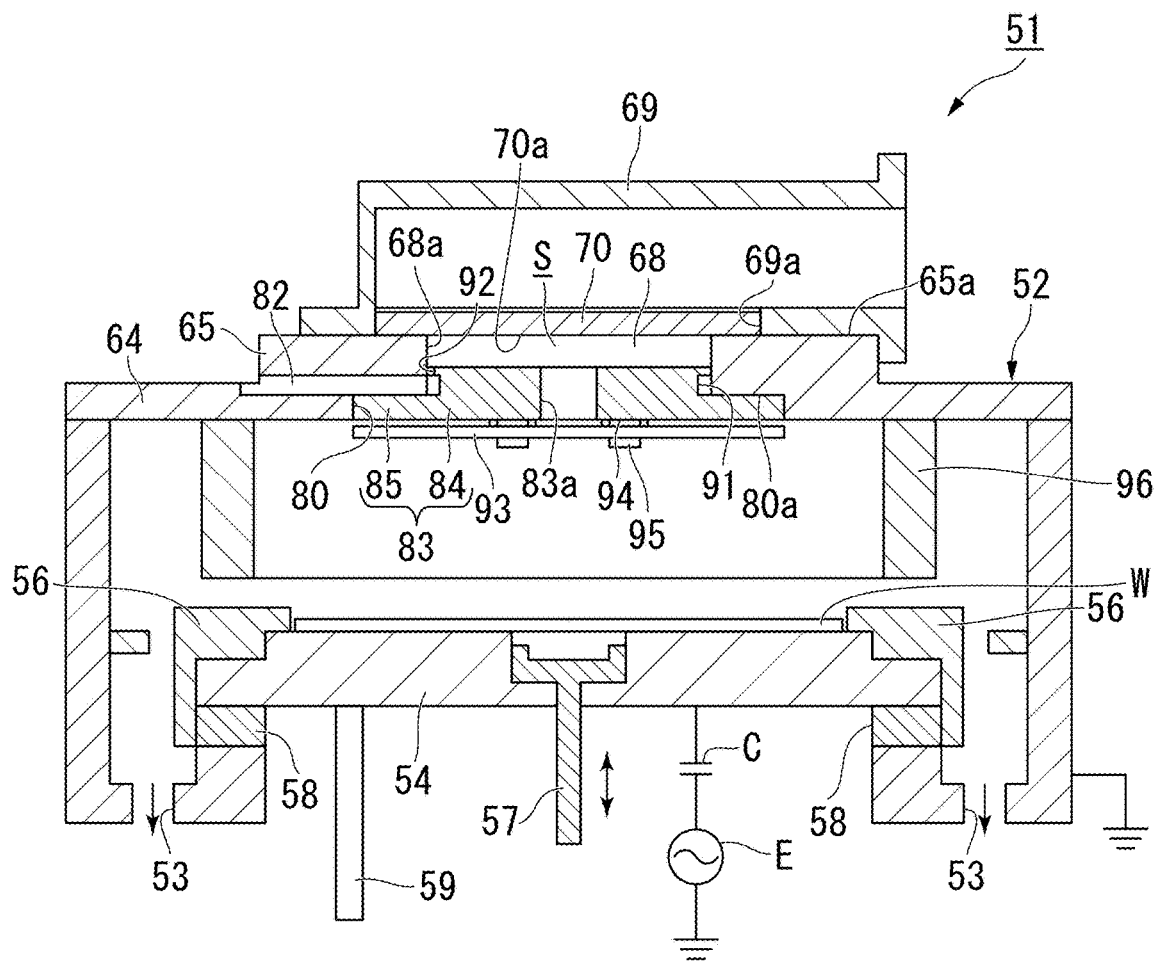
FIG. 1 is a cross-sectional view showing an example of an ashing apparatus using a method of processing a wiring substrate according to an embodiment of the invention.

Hereinafter, an embodiment for carrying out the invention will be described with reference to FIG. 1. FIG. 1 is a cross-sectional view showing an example of an ashing apparatus used in the invention, the ashing apparatus is used in (step A) of removing an organic member from the surface layer side of the resin which will be described later.

A chamber 52 that constitutes the ashing apparatus 51 is made of the same metal as the metal that is mainly exposed from a substrate W to be processed in the chamber 52. Furthermore, a metal that forms the chamber 52 is exposed inside the chamber 52. For example, in the case of an ashing apparatus in which the substrate W having copper (Cu) exposed therefrom is subjected to ashing treatment, the aforementioned chamber 52 is made of copper. Consequently, the chamber 52 is formed of not only copper but also gold (Au), solder (Solder), platinum (Pt), or iridium (Ir) in accordance with a metal exposed from the substrate W.

A top plate 64 forming the chamber 52 has a cylindrical body 65 that protrudes upwardly toward the outside of the top plate 64. A through hole 68 that penetrates through the outside and the inside of the chamber 52 is formed at the center position of the cylindrical body 65.

A waveguide tube 69 is connected and fixed to the upper surface 65a of the cylindrical body 65. A connection hole 69a is formed at the position corresponding to the through hole 68 in the waveguide tube 69, and a disk-shaped microwave transmission window 70 is disposed at the connection hole 69a so as to block an upper side opening of the through hole 68. The microwave transmission window 70 is a dielectric transmission window made of ceramics, quartz, or the like and is in close contact with and fixed to the upper surface 65a of the cylindrical body 65. In this structure, from a microwave oscillator which provided at the upstream side of the waveguide tube 69 and is not shown in the figure, microwave propagates through the waveguide tube 69 via the microwave transmission window 70 and is introduced into the through hole 68.

A fitting recess 80 that includes an opening that is expanded so as to have an internal diameter larger than an internal diameter of the through hole 68 is formed at a lower side opening of the through hole 68.

The lower side opening of the through hole 68 in which the fitting recess 80 is formed is blocked by a disk-shaped lower lid 83. The lower lid 83 includes: a disk-shaped lower lid body 84 having an introduction hole 83a that is formed at the center thereof and penetrates therethrough; and a flange portion 85 that is formed so as to extend toward the lower outer peripheral face of the lower lid body 84. The lower lid 83 is configured so that the lower lid body 84 is inserted into the through hole 68 and the flange portion 85 is fitted into the fitting recess 80.

Additionally, by screwing the flange portion 85 to a back surface 80a of the fitting recess 80, the lower lid 83 (top surface of the flange portion 85) is fastened and fixed to the top plate 64 (back surface 80a of the fitting recess 80).

Accordingly, a plasma generation chamber S is formed and comparted in a space which is formed such that both an upper opening and a lower opening of the through hole 68 formed on the cylindrical body 65 are blocked by the microwave transmission window 70 and the lower lid 83.

A ring-shaped annular groove 91 is formed on the outer peripheral face of the lower lid body 84, and the annular groove 91 and an inner peripheral face 68a of the through hole 68 that blocks the annular groove 91 form an annular passage. The annular groove 91 is formed at the position opposed to the opening of a gas introduction channel 82 formed on the inner peripheral face 68a of the through hole 68, and a plasma generation gas (oxygen) that is supplied from the gas introduction channel 82 is introduced into the annular passage (annular groove 91).

A top surface outer circumferential edge of the lower lid body 84 is cleaved, and therefore a cleaved groove (gas introduction channel 82) that communicates the plasma generation chamber S to the annular groove 91 (annular passage) is formed. In addition, the plasma generation gas introduced into the annular groove 81 is introduced into the plasma generation chamber S through the cleaved groove.

Similarly, the plasma generation gas introduced into the plasma generation chamber S is excited by microwave input through the microwave transmission window 70 and thereby becomes oxygen plasma. Subsequently, the oxygen plasma generated in the plasma generation chamber S is introduced into the substrate (wafer) W mounted on a lower substrate stage 54 through the introduction hole 83a formed on the lower lid 83.

A diffusion plate 93 is disposed at the position that is lower than the lower lid body 84 and is opposed to the opening of the introduction hole 83a. The diffusion plate 93 is made of aluminum (Al) is connected and fixed to the lower lid body 84 by an attachment member 95 via a spacing member 94 made of the same aluminum (Al). The diffusion plate 93 disperses oxygen plasma supplied from the introduction hole 83a of the lower lid body 84 and causes the substrate W mounted on the substrate stage 54 to be uniformly exposed to the same oxygen plasma. Because of this, on the substrate W mounted on the substrate stage 54, a desired film formed on the surface Wa of the substrate W (top surface in FIG. 1) is subjected to ashing by the oxygen plasma.

Note that, a configuration may be adopted in which a cylindrical-shape diffusion prevention wall 96 is attached to the inner bottom surface of the top plate 64 so as to surround the diffusion plate 93. The diffusion prevention wall 96 is made of, for example, aluminum (Al), and functions to guide oxygen plasma supplied from the diffusion plate 93 to be directed to the substrate W disposed at the lower side so that the guide oxygen plasma is not diffused toward the inner side surface of the chamber 52.

The upper periphery of the substrate stage 54 is covered with a substrate guide 56. Ends of lift pins 57 that are supported movably in the vertical direction are disposed in the substrate stage 54. By moving the lift pins 57 upward and downward, sending and receiving of the substrate W between the lift pins 57 and a transfer device which is not shown in the figure are carried out, and the substrate W is mounted on the substrate stage 54.

An insulating plate 58 is interposed between the substrate stage 54 and the lower portion of the chamber 52. Moreover, a pipe 59 is connected to the substrate stage 54, cooling water is supplied through the pipe 59 to a water passage which is formed inside the substrate stage 54 and is not shown in the figure, and temperature control of the substrate stage 54 is carried out. In addition, a high-frequency power supply E is connected to the substrate stage 54 via a condenser C, and a high-frequency bias (RF bias) is supplied from the high-frequency power supply E to the substrate stage 54.

On the other hand the above-mentioned chamber 52 is connected to the ground and functions as an electrical counter electrode with respect to the high-frequency bias that is supplied from the high-frequency power supply E to the substrate stage 54. As described below, the diffusion plate 93 is electrically connected to the chamber 52 via the attachment member 95 and the diffusion prevention wall 96 is electrically connected to the chamber. Consequently, the chamber 52, the diffusion plate 93, and the diffusion prevention wall 96 which are formed of the aforementioned same metal function as a counter electrode with respect to the above-mentioned high-frequency bias.

A vacuuming port 53 is formed on a bottom portion of the chamber 52. The vacuuming port 53 is connected to a vacuum pump which is not shown in the figure via a vacuuming pipe which is not shown in the figure. The pressure of the internal space of the chamber 52 is reduced by the vacuum pump. A pressure control device which is not shown in the figure is disposed at the vacuuming pipe, and the pressure inside the chamber 52 is controlled by the pressure control device.

FIGS. 2A to 2J are explanatory diagrams showing a method of manufacturing a multi-layer wiring substrate, which includes a step A of removing an organic member from a surface layer side of resin in the method of processing a wiring substrate according to the embodiment of the invention. The step A applied to the invention is in between FIG. 2A to FIG. 2I, and the step A will be particularly described with respect to FIGS. 3A to 6B.

Figure 2A:
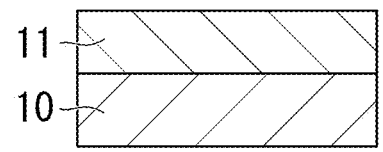
FIG. 2A is a view showing an example of a process including a step of removing an organic member from the surface layer side of the resin in the method of processing a wiring substrate according to the embodiment of the invention.

In FIG. 2A, a first interlayer insulating film 11 is disposed on one surface (top surface in FIG. 2A) of a copper clad laminate (CCL: Copper Clad Laminate) 10. As the first interlayer insulating film 11, for example, ABF (Ajinomoto Build-up Film) or the like is preferably used.

Figure 2B:
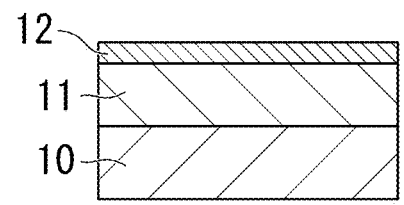
FIG. 2B is a view showing an example of a process including a step of removing the organic member from the surface layer side of the resin in the method of processing a wiring substrate according to the embodiment of the invention.

In FIG. 2B, a seed layer 12 used for a Cu coating which will be formed later is provided so as to coat the interlayer insulating film 11. As the seed layer 12, for example, Ni film, Cr film, W film, Mo film, or the like is preferably used.

Figure 2C:
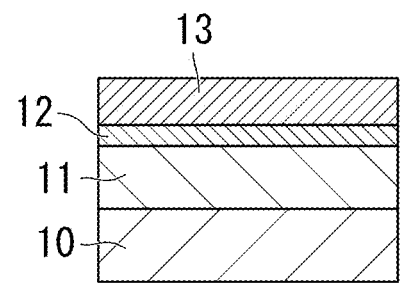
FIG. 2C is a view showing an example of a process including a step of removing the organic member from the surface layer side of the resin in the method of processing a wiring substrate according to the embodiment of the invention.

In FIG. 2C, a dry film resist (DFR: Dry Film Resist) 13 is provided so as to coat the seed layer 12.

Figure 2D:
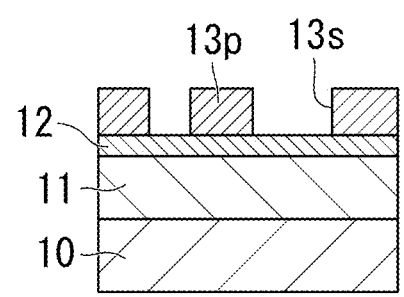
FIG. 2D is a view showing an example of a process including a step of removing the organic member from the surface layer side of the resin in the method of processing a wiring substrate according to the embodiment of the invention.

In FIG. 2D, openings 13s are provided on the dry film resist 13 in order to manufacture a Cu coating on the seed layer 12 with a predetermined pattern. Consequently, a dry film resist 13p having the openings 13s is formed.

Figure 2E:
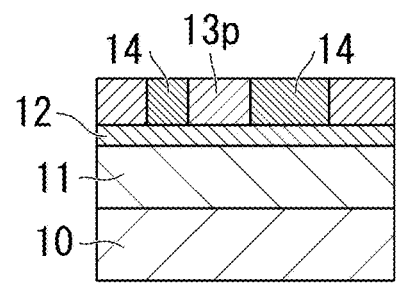
FIG. 2E is a view showing an example of a process including a step of removing the organic member from the surface layer side of the resin in the method of processing a wiring substrate according to the embodiment of the invention.

In FIG. 2E, a Cu coating 14 is manufactured on the seed layer 12 exposed by the openings 13s by an electroplating method.

Figure 2F:
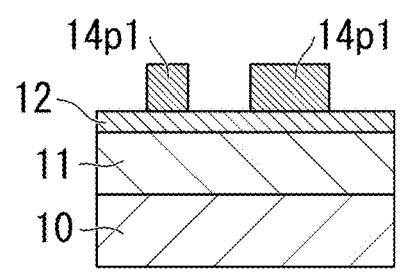
FIG. 2F is a view showing an example of a process including a step of removing the organic member from the surface layer side of the resin in the method of processing a wiring substrate according to the embodiment of the invention.

In FIG. 2F, a Cu coating 14p1 that is patterned on the seed layer 12 is obtained by removing the dry film resist 13p. The Cu coating 14p1 according to the embodiment of the invention is used as a fine wiring (first electroconductive film) having, for example, a height of approximately 2 μm and a width of approximately 2 μm to 4 μm.

Figure 2G:
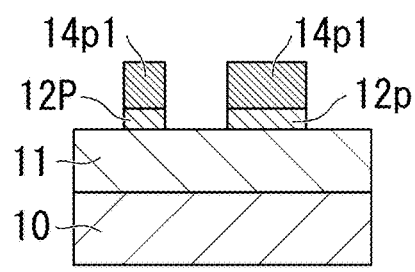
FIG. 2G is a view showing an example of a process including a step of removing the organic member from the surface layer side of the resin in the method of processing a wiring substrate according to the embodiment of the invention.

In FIG. 2G, the patterned Cu coating 14p1 is used as a mask, and a seed layer 12 is removed etching. Accordingly, a configuration is obtained in which the seed layers 12p located at the positions which overlap the patterned Cu coating 14p1 only remain.

Figure 2H:
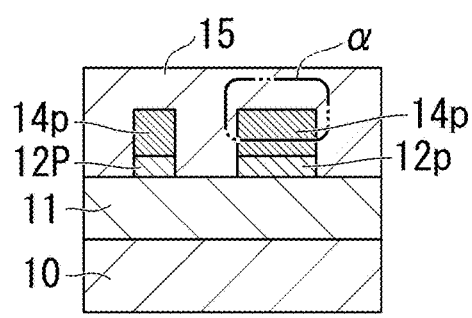
FIG. 2H is a view showing an example of a process including a step of removing the organic member from the surface layer side of the resin in the method of processing a wiring substrate according to the embodiment of the invention.

In FIG. 2H, a second interlayer insulating film 15 is disposed so as to coat the first interlayer insulating film 11 and the patterned Cu coating 14p1 located thereon.

Figure 2I:
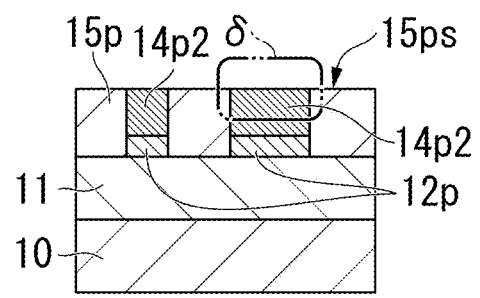
FIG. 2I is a view showing an example of a process including a step of removing the organic member from the surface layer side of the resin in the method of processing a wiring substrate according to the embodiment of the invention.

FIG. 2I, the second interlayer insulating film 15 is subjected to ashing treatment until the surface of the Cu coating 14p1 is exposed (step A). Therefore, an organic member is removed from the surface layer side of the resin constituting the second interlayer insulating film 15. By carrying out the above-described step A, an organic member is only removed from the resin while leaving inorganic members until a desired depth (surface position of the Cu coating 14p1) is obtained.

Thereafter, of the second interlayer insulating film 15, the portions that were subjected to the step A (i.e., inorganic members remaining on the surface layer side of the resin which was subjected to the step A) are removed by carrying out wet cleaning. Because of this, the inorganic members, which are located above the surface of the patterned Cu coating (conductors) 14p1, remain on the resin, and form a filler, are removed by wet cleaning.

As a result, the surfaces of the exposed Cu coating (conductors) 14p2 and the surface of the second interlayer insulating film (resin) 15 surrounding the conductors 14p2 are on the same plane.

Figure 2J:
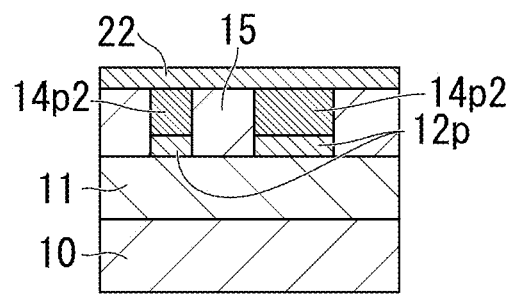
FIG. 2J is a view showing an example of a process including a step of removing the organic member from the surface layer side of the resin in the method of processing a wiring substrate according to the embodiment of the invention.

In FIG. 2J, a second the seed layer 22 is formed on the surface planarized by treatment shown in FIG. 2I. Thereafter, by repeating the various steps of the above-mentioned FIGS. 2C to 2I, it is possible to manufacture a multi-layer wiring substrate having a desired layered structure.

Hereinbelow, the steps A and B according to the embodiment of the invention which were described with reference to the aforementioned FIGS. 2H to 2I will be particularly described using FIGS. 3A to 6B.

Figure 3A:
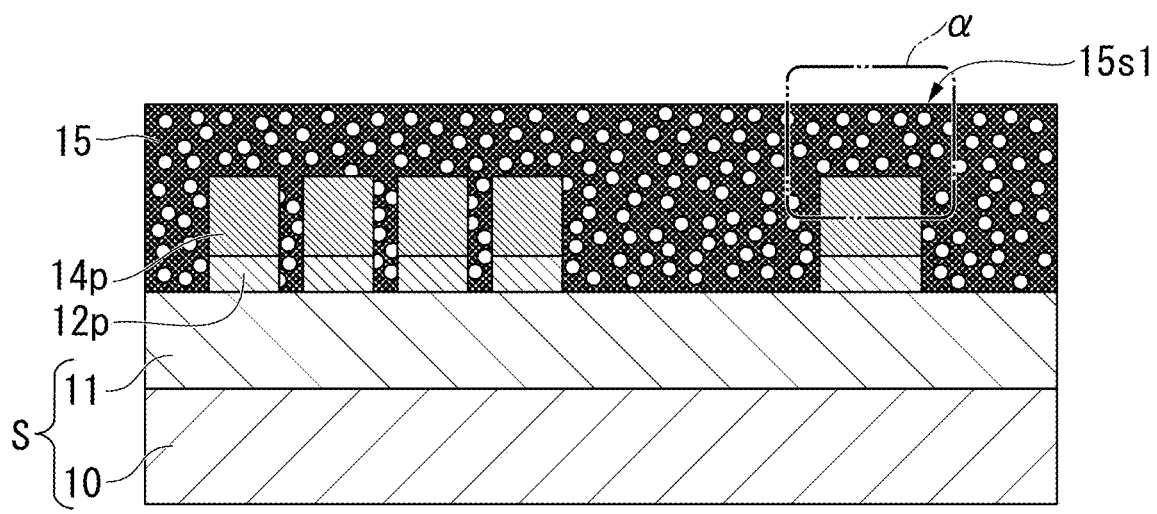
FIG. 3A is a cross-sectional view showing a state where before a step of removing the organic member from the surface layer side of the resin is carried out.
Figure 3B:
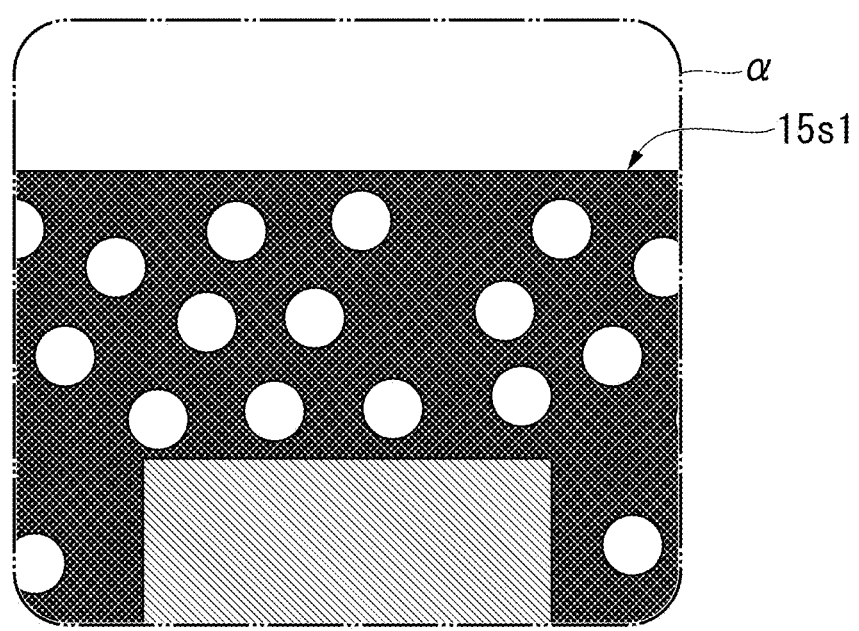
FIG. 3B is an enlarged view in which the portion represented by reference numeral α in FIG. 3A is enlarged.

FIGS. 3A and 3B are cross-sectional views showing a state where before the step A according to the embodiment of the invention is carried out and correspond to FIG. 2H.

FIG. 3A is a cross-sectional view showing a wide region including a plurality of patterned Cu coatings (conductors). FIG. 3B is a view focusing on a specific patterned Cu coatings (conductors) and is a cross-sectional view showing an enlarged region (α) including the upper portion of the Cu coating and the surrounding thereof and the resin located thereabove.

Figure 4A:
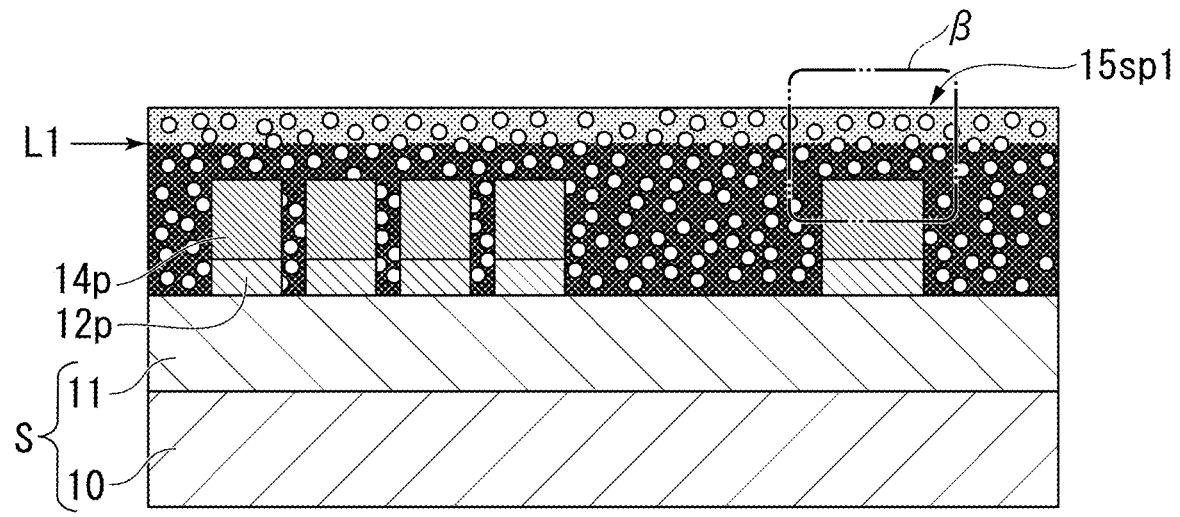
FIG. 4A is a cross-sectional view showing a state where a step of removing the organic member from the surface layer side of the resin was carried out until a thickness of the resin becomes substantially a half of the thickness shown in FIG. 3A.
Figure 4B:
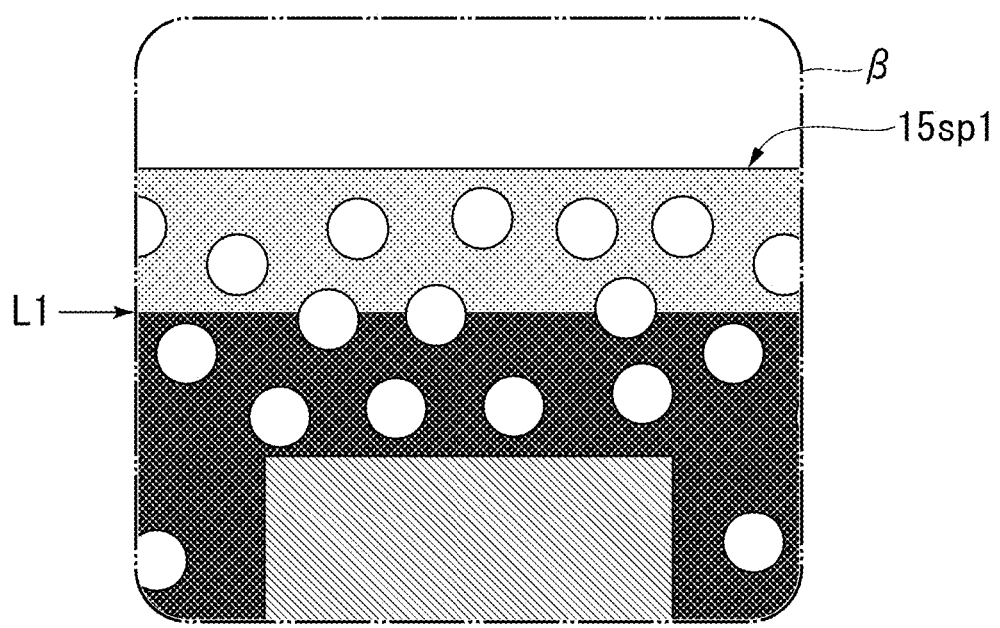
FIG. 4B is an enlarged view in which the portion represented by reference numeral β in FIG. 4A is enlarged.

FIGS. 4A and 4B are cross-sectional views showing a state where the step A was carried out until a thickness of the resin becomes substantially a half of the thickness shown in FIG. 3A. FIG. 4A is a cross-sectional view showing a wide region including a plurality of patterned Cu coatings (conductors). FIG. 4B is a view focusing on a specific patterned Cu coatings (conductors) and is a cross-sectional view showing an enlarged region (β) including the upper portion of the Cu coating and the surrounding thereof and the resin located thereabove.

Figure 5A:
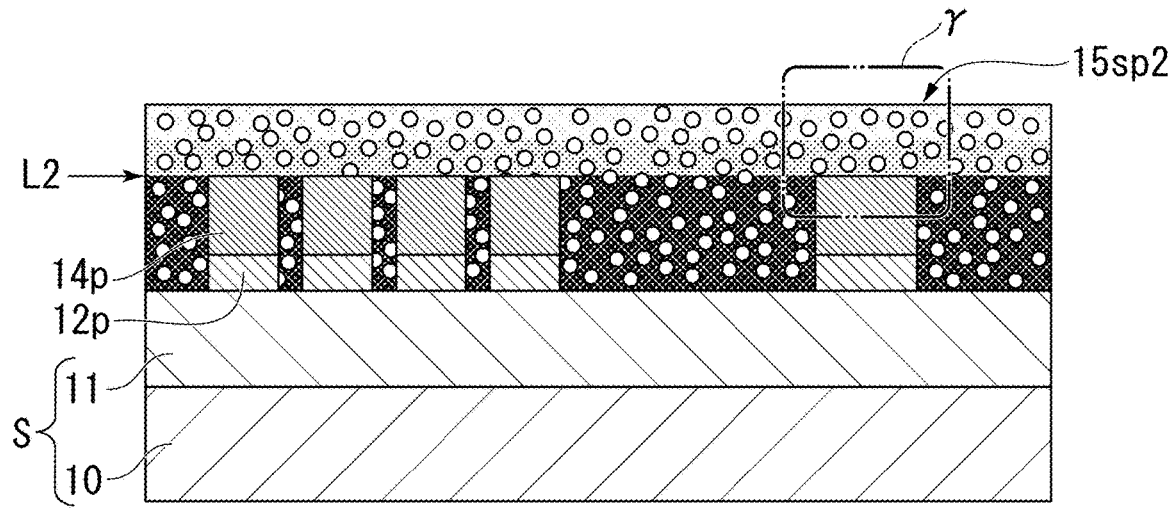
FIG. 5A is a cross-sectional view showing a state where a step of removing the organic member from the surface layer side of the resin was carried out until positions of the surfaces of the conductors coincide with a top surface of the resin.
Figure 5B:
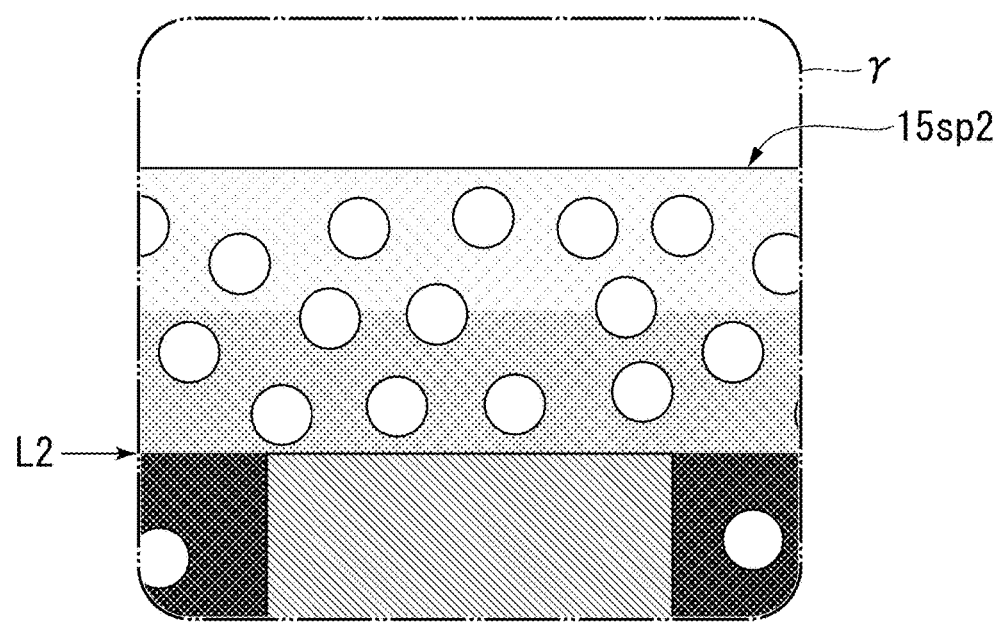
FIG. 5B is an enlarged view in which the portion represented by reference numeral γ in FIG. 5A is enlarged.

FIGS. 5A and 5B are cross-sectional views showing a state where the step A was carried out until positions of the surfaces of the conductors coincide with a top surface of the resin. FIG. 5A is a cross-sectional view showing a wide region including a plurality of patterned Cu coatings (conductors). FIG. 5B is a view focusing on a specific patterned Cu coatings (conductors) and is a cross-sectional view showing an enlarged region (γ) including the upper portion of the Cu coating and the surrounding thereof and the resin located thereabove.

Figure 6A:
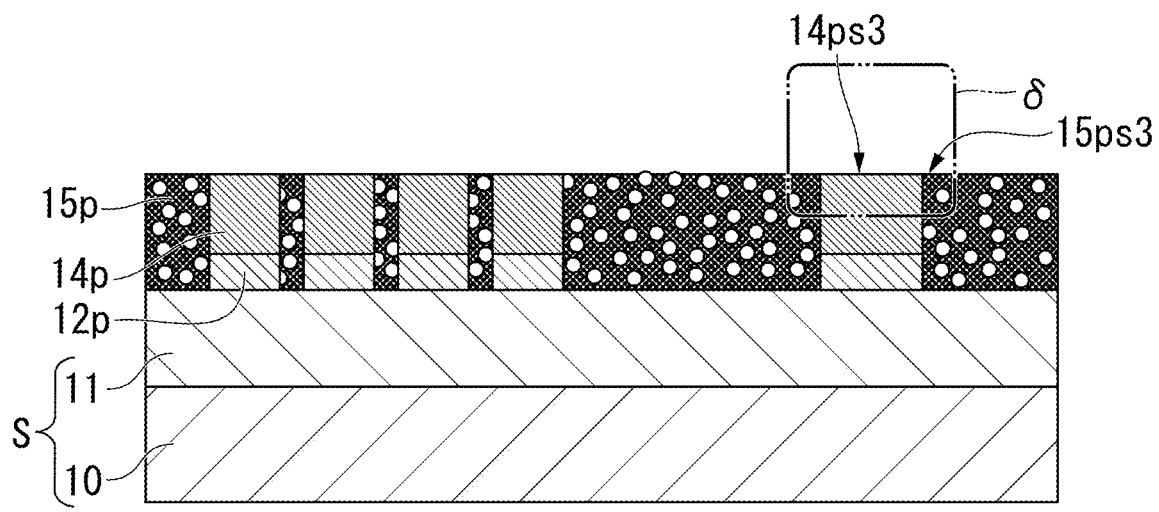
FIG. 6A is a cross-sectional view showing a state where a step of removing inorganic members remaining on the surface layer side of the resin at which the organic member is removed was carried out in the method of processing a wiring substrate according to the embodiment of the invention.
Figure 6B:
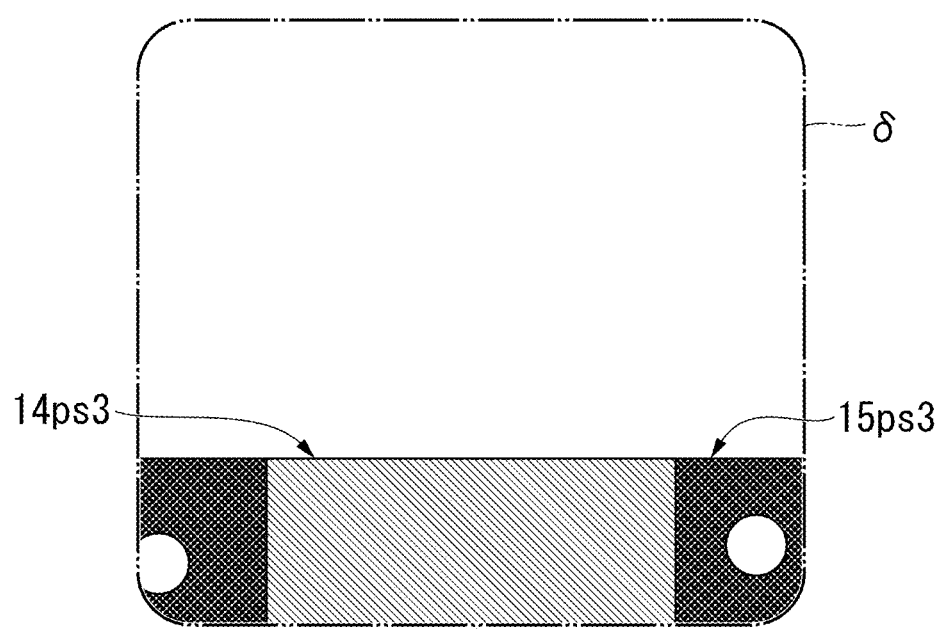
FIG. 6B is an enlarged view in which the portion represented by reference numeral δ in FIG. 6A is enlarged.

FIGS. 6A and 6B are cross-sectional views showing a state where the step B of the invention was carried out and correspond to FIG. 2I. FIG. 6A is a cross-sectional view showing a wide region including a plurality of patterned Cu coatings (conductors). FIG. 6B is a view focusing on a specific patterned Cu coatings (conductors) and is a cross-sectional view showing an enlarged region (δ) including the upper portion of the Cu coating and the surrounding thereof and the resin located thereabove.

FIGS. 3A and 3B show a state where the second interlayer insulating film 15 is disposed so as to coat the first interlayer insulating film 11, the patterned Cu coating 14$p$1 located thereon, and the seed layer 12$p$ located at the position which overlaps the Cu coating 14$p$1.

The second interlayer insulating film 15 has a configuration in which is coated with a resin having inorganic members (shown by a plurality of white dots in FIGS. 3A and 3B) that form a filler and are dispersed in an organic member (shown by a thick black meshed pattern in FIGS. 3A and 3B). In FIG. 3A, reference numeral 15$s$1 shows a surface of the second interlayer insulating film 15.

As shown in FIG. 3B, the second interlayer insulating film 15 before the step A is carried out is the resin having the inorganic members that form a filler and are dispersed in the organic member. In the state shown in FIGS. 3A and 3B, the Cu coatings (conductors) 14$p$ locally disposed on the substrate W is covered with the resin.

FIGS. 4A and 4B show a state where the step A was carried out until a thickness of the second interlayer insulating film (resin) 15 becomes substantially a half. In FIGS. 4A and 4B, reference numeral L1 represents a boundary between the post-treated region by the step A and an untreated region. That is, in the second interlayer insulating film (resin) 15, the region (shown by thin black meshed pattern in FIGS. 4A and 4B) that is located lower than the surface 15$sp$1 and located above the portion represented by reference numeral L1 is the portion that was subjected to the step A (post-treated region). In contrast, the region (shown by a thick black meshed pattern in FIGS. 4A and 4B) that is located lower than the portion represented by reference numeral L1 is the portion (untreated region) which has not been carried out yet.

In FIG. 4B, the portion that was subjected to the step A (post-treated region) is in a state where the inorganic members included in the resin remain and the organic member is only degraded and removed. The above-described ashing treatment is also referred to as an ashing process.

FIGS. 5A and 5B show a state where the aforementioned ashing treatment (step A) were further repeatedly carried out, and the portion from which the organic member is only removed, that is, the portion that was subjected to the step A (post-treated region) reached the surfaces of the Cu coatings (conductors) 14$p$ locally disposed on the substrate W. In FIGS. 5A and 5B, reference numeral L2 represents a boundary between the post-treated region that is subjected to the step A and the untreated region. That is, in the second interlayer insulating film (resin) 15, the region (shown by thin black meshed pattern in FIGS. 5A and 5B) that is located lower than the surface 15$sp$2 and located above the portion represented by reference numeral L2 is the portion that was subjected to the step A (post-treated region). In contrast, the region (shown by a thick black meshed pattern in FIGS. 5A and 5B) that is located lower than numeral L2 is the portion (untreated region) which has not been carried out yet.

In FIG. 5B, the portion that was subjected to the step A (post-treated region) is in a state where the inorganic members included in the resin remain and the organic member is only degraded and removed.

Accordingly, a state is obtained where organic member does not mostly remain in the second interlayer insulating film (resin) 15 that is located above the surfaces of the Cu coatings (conductors) 14$p$ (portion represented by reference numeral L2) and inorganic members forming a filler only remain. On the other hand, the second interlayer insulating film (resin) 15 located lower than the surfaces of the Cu coatings (conductors) 14$p$ is in a state of not being changed from before ashing is carried out, that is, a state is maintained where the inorganic members forming a filler are dispersed in the organic member.

In the above-mentioned FIGS. 4A (4B) and 5A (5B), for the sake of convenience of explanation, it is shown that the step A is divided into two steps, but in general, FIG. 4A and FIG. 5A are carried out as a continuous process (one step A). However, as necessary, the step A may be carried out as a plurality of steps (a plurality of times).

FIGS. 6A and 6B show a state where (step B) the inorganic members that remain in the surface layer side of the resin after being subjected to the step A is removed by use of a wet cleaning method with respect to the wiring substrate which is in a state shown in FIG. 5A, that is, in a state where a ashing treatment (step A) was carried out until the positions of the surfaces of the Cu coatings 14$p$1 coincides with the top surface of the second interlayer insulating film 15. Therefore, the inorganic members that form a filler and remain in the resin located above the surfaces of the conductors are removed by wet cleaning. On the other hand, the resin located lower than the surfaces of the conductors is in an original state, that is, it is maintained in a state where the inorganic members forming a filler are dispersed in the organic member without being affected by wet cleaning.

Accordingly, the invention contributes to provision of a method of processing a wiring substrate which can carry out a process so that the surfaces 14$ps$3 of exposed conductors and the surface 15*ps*3 of the resin surrounding the conductors are on the same plane in order to manufacture a layered structure.

Figure 7:
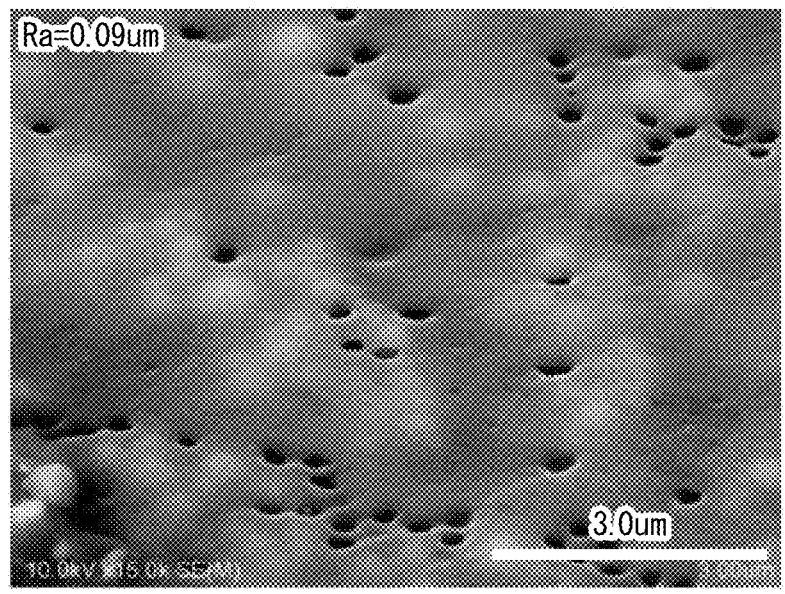
FIG. 7 is an SEM picture showing the surface of the resin in the state shown in FIGS. 3A and 3B.

FIG. 7 is an SEM picture showing the surface of the resin in a state shown in FIG. 3A (a previous state where the step A is carried out. From this picture, it was apparent that the surface of the second interlayer insulating film (resin) 15 has a profile including micro recesses provided on a substantially flat shape. The average roughness height Ra of this surface was 0.09 µm.

Figure 8:
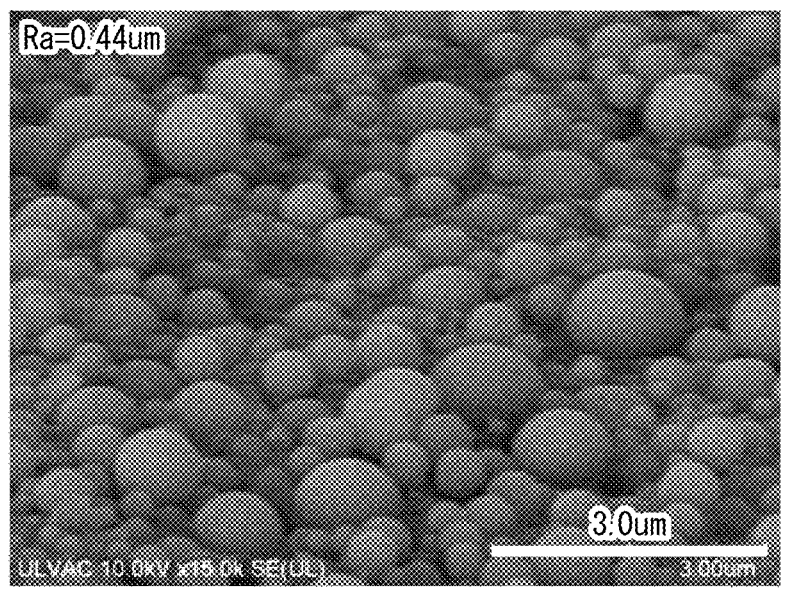
FIG. 8 is an SEM picture showing the surface of the resin in the state shown in FIGS. 5A and 5B.

FIG. 8 is an SEM picture showing the surface of the resin in a state shown in FIG. 5A (a state where the portion that was subjected to the step A (post-treated region) reaches the surfaces of the Cu coatings (conductors) 14*p* locally disposed on the substrate W). From this picture, it was apparent that the entire surface of the second interlayer insulating film (resin) 15 are covered with hemispherical structures, the aforementioned structures forms projecting portions, and a gap between the structures forms a recess. The average roughness height Ra of this surface was 0.44 µm.

Accordingly, it was inferred that the second interlayer insulating film (resin) 15 which was subjected to the step A is in a state where organic member does not mostly remain and inorganic members forming a filler only remain.

Figure 9:
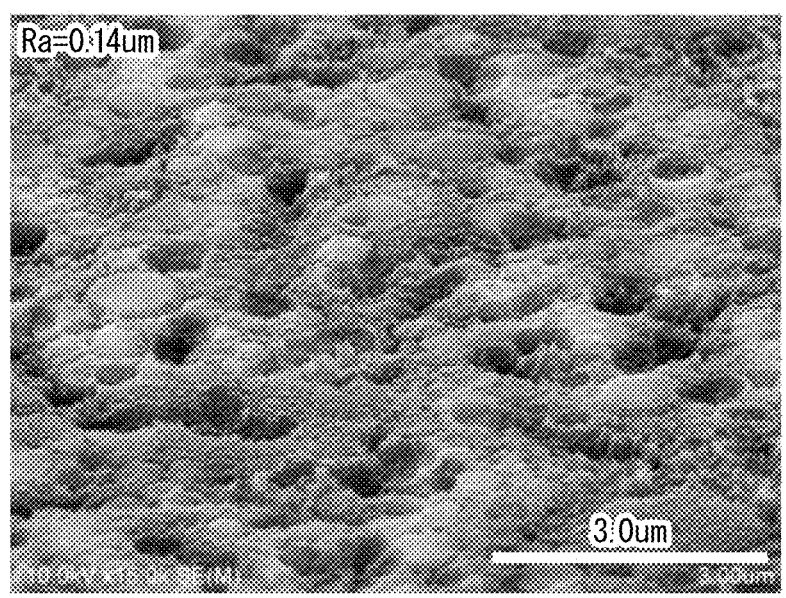
FIG. 9 is an SEM picture showing the surface of the resin in the state shown in FIGS. 6A and 6B.

FIG. 9 is an SEM picture showing the surface of the resin in a state shown in FIG. 6A (a state where, after the step A is carried out, the inorganic members remaining on the surface layer side of the resin which was subjected to the step A is removed by use of a wet cleaning method). From this picture, it was apparent that the surface of the second interlayer insulating film (resin) 15 has a profile including micro recesses provided on a substantially flat shape. This means that, in the picture (FIG. 8) showing that the step A was carried out, it was apparent that the hemispherical structures which are present on the surface of the second interlayer insulating film (resin) 15 are removed by carrying out the step B. The average roughness height Ra of this surface was 0.14 µm.

From the results of FIGS. 7 to 9, the following points were apparent.

By carrying out the step B subsequent to the step A, the inorganic members that form a filler and remain in the resin located above the surfaces of the conductors are removed by wet cleaning.

On the other hand, the resin located lower than the surfaces of the conductors is in an original state, that is, it is maintained in a state where the inorganic members forming a filler are dispersed in the organic member without being affected by wet cleaning.

Accordingly, the invention contributes to provision of a method of processing a wiring substrate which can carry out a process so that the surfaces of exposed conductors and the surface of the resin surrounding the conductors are on the same plane in order to manufacture a layered structure.

In order to carry out the above-described step A, the ashing apparatus 51 shown in FIG. 1 is preferably used. When use of the ashing apparatus 51, conditions of the types and the flow rate of a processing gas, a process pressure, a substrate temperature, output of microwave, a bias RF output to be applied to the substrate are determined.

The aforementioned processings shown in FIG. 8 were carried out based on the following values and the results were obtained. As a processing gas, three types of gases ($O_2$, $N_2$, $CF_4$) were used.

Processing gas 1: oxygen ($O_2$), the flow rate is 3200 sccm
Processing gas 2: nitrogen ($N_2$), the flow rate is 400 sccm
Processing gas 3: carbon tetrafluoride ($CF_4$), the flow rate is 0 to 500 sccm
Process pressure: 40 to 100 Pa
Substrate temperature: 30° C.
Microwave output: 2000 to 2500 W
Bias RF output: 0 to 1500 W The above-described values are representative examples, the invention is not limited to the values and combination thereof. For example, regarding the power density of a bias RF ($W/cm^2$), 0.2 to 0.8 is preferable, and 0.4 to 0.6 is more preferable. In the case of being lower than 0.2 ($W/cm^2$), it causes the ashing rate to decrease, in the case of being higher than 0.8 ($W/cm^2$), roughing of a surface due to physical etching effect due by ions occurs, and therefore it is not preferable.

Figure 10:
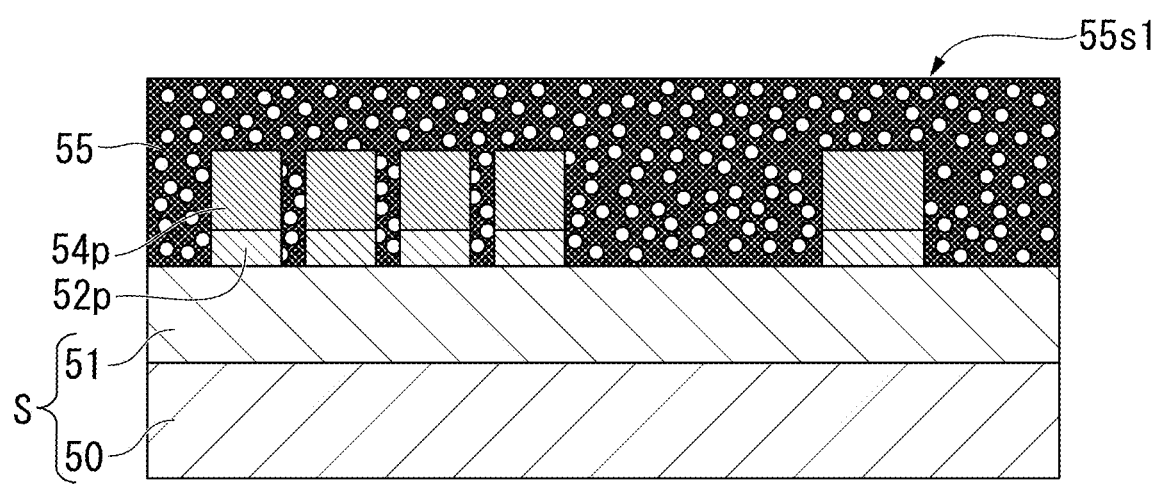
FIG. 10 is a cross-sectional view showing a state where before a conventional processing method is carried out (the same state as those of FIGS. 3A and 3B).
Figure 11:
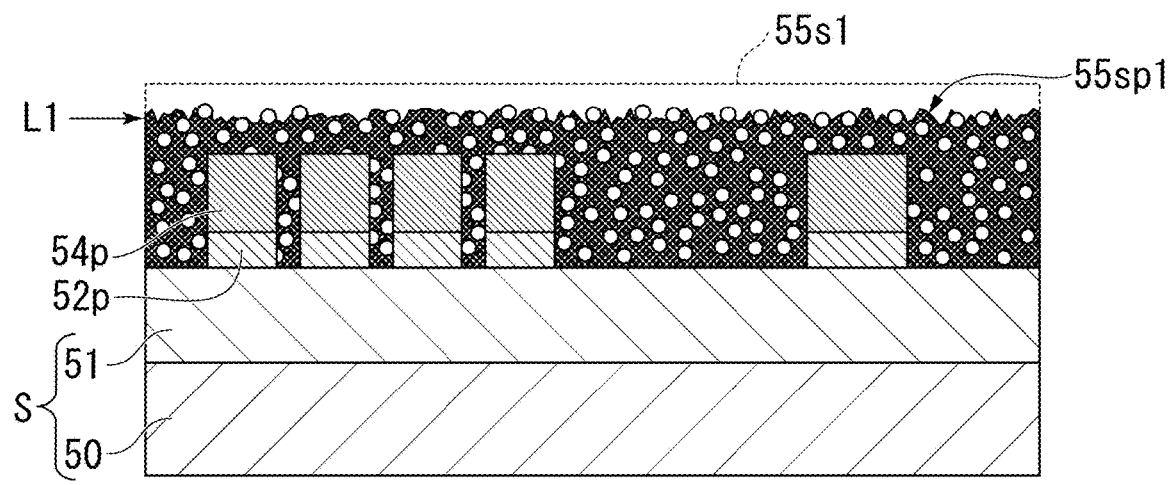
FIG. 11 is a cross-sectional view showing a state where a conventional processing method was carried out until a thickness of a resin becomes substantially a half of the thickness shown in FIG. 10.
Figure 12:
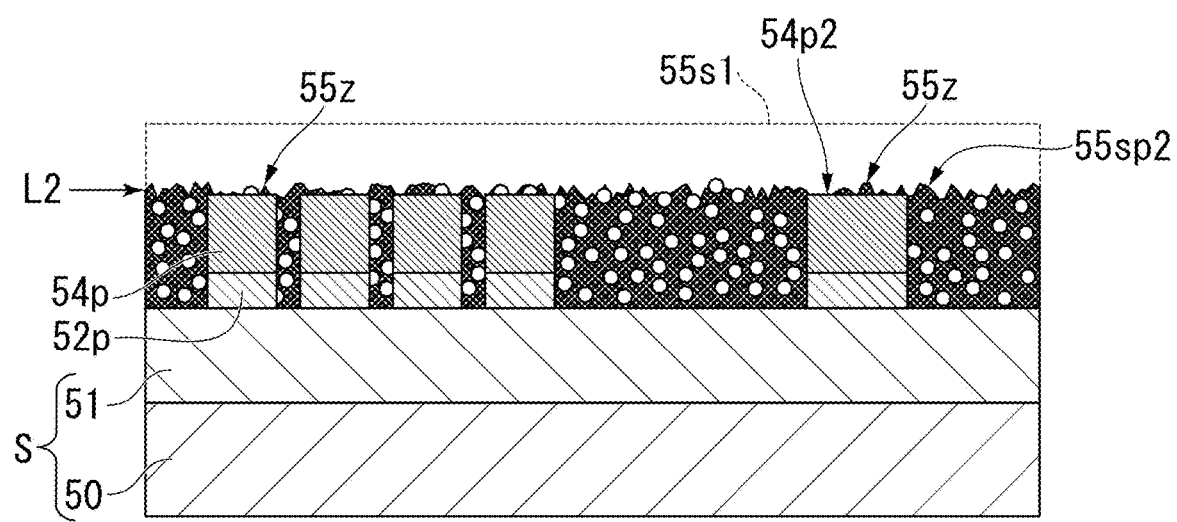
FIG. 12 is a cross-sectional view showing a state where a conventional processing method was carried out until positions of surfaces of the conductors coincide with a top surface of the resin.

FIGS. 11 and 12 are cross-sectional views each showing a state of a wiring substrate that was subjected to a conventional processing method (dry etching treatment). FIG. 11 is a cross-sectional view showing a state of the wiring substrate that was subjected to treatment by a conventional processing method until the thickness of a resin becomes substantially a half of the thickness shown in FIG. 10. FIG. 12 is a cross-sectional view showing a state of the wiring substrate that was subjected to treatment by a conventional processing method until positions of surfaces of the conductors coincide with a top surface of the resin. Note that, FIG. 10 shows a state where before a conventional processing method is carried out. That is, FIG. 10 shows the same state as that of FIG. 3A.

From FIG. 11, in a state where the treatment was carried out until a thickness of the resin becomes substantially a half of the thickness shown in FIG. 10, inorganic members forming a filler are exposed from the surface (portion represented by reference numeral L1) that was subjected to dry etching treatment, projecting portions are formed thereon, and also the surface of the organic member is significantly rough by etching and forms an irregular shape.

From FIG. 12, in a state where a treatment by a conventional processing method was carried out until positions of the surfaces of the conductors coincide with a top surface of the resin, similar to FIG. 11, the inorganic members forming a filler are exposed and projecting portions are formed on the surface (position represented by reference numeral L2) that was subjected to dry etching treatment, and also the surface of the organic member is significantly rough by etching and forms an irregular shape. In addition to this, since the inorganic members forming a filler or the organic member remain on the surfaces of the conductors, a flat profile is not obtained.

Figure 13:
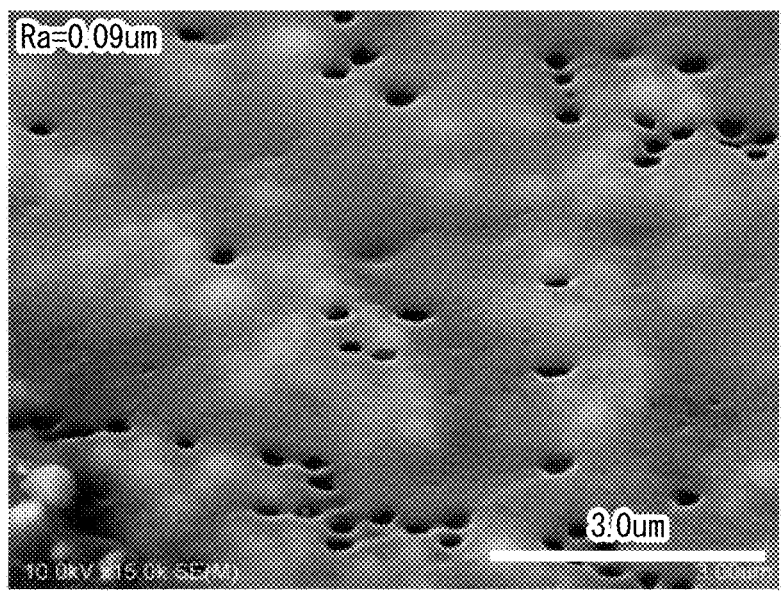
FIG. 13 is an SEM picture showing the surface of the resin in the state shown in FIG. 10.

FIG. 13 is an SEM picture showing the surface of the resin in the state (a state where before a conventional processing method is carried out) shown in FIG. 10, and is the same as that of FIG. 7.

From the picture shown in FIG. 13, it was apparent that a surface 55*s*1 (position represented by reference numeral L1) of a first interlayer insulating film (resin) 55 has a profile including micro recesses provided on a substantially flat shape. The average roughness height Ra of this surface was 0.09 µm.

Figure 14:
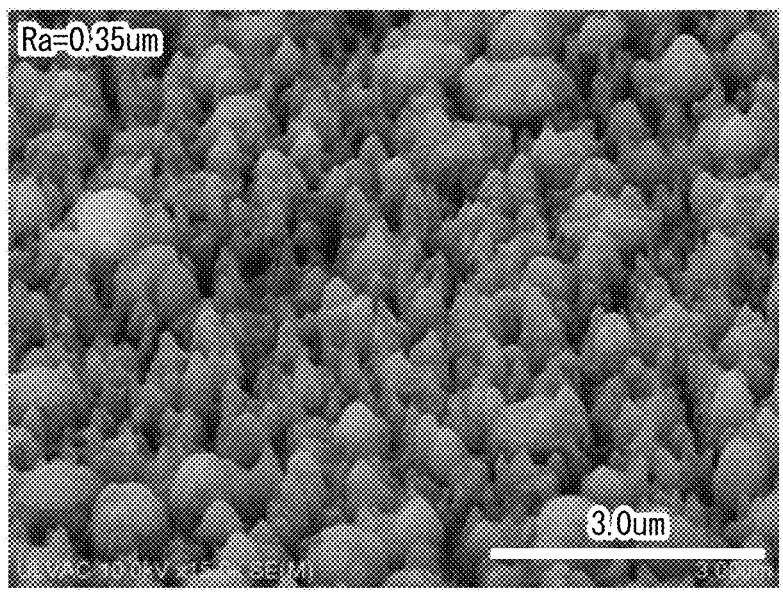
FIG. 14 is an SEM picture showing the surface of the resin in the state shown in FIG. 12.

From the picture shown in FIG. 14, it was apparent that the inorganic members forming a filler are exposed and projecting portions are formed on the surface 55*s*1 (position represented by reference numeral L2) of the first interlayer insulating film (resin) 55 and also the surface of the organic member is significantly rough by etching and forms an irregular shape. The average roughness height Ra of this surface was 0.35 µm.

From the results of FIGS. 12 and 13, the following points were apparent.

In a conventional processing method (dry etching method), the inorganic members forming a filler which are present inside the resin are exposed and form the projecting portions. Furthermore, the surface of the organic member which is present inside the resin is significantly rough by etching and forms an irregular shape. Even where it reaches a depth at which the surfaces of the conductors are exposed by proceeding dry etching, since the inorganic members forming a filler or the organic member remain, a flat profile is not obtained.

Consequently, in the conventional processing method (dry etching method), it was extremely difficult to carry out a process so that the surfaces of exposed conductors and the surface of the resin surrounding the conductors are on the same plane in order to manufacture a layered structure.

While preferred embodiments of the invention have been described and shown above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

For example, in the method of processing a wiring substrate according to the above-mentioned embodiment of the invention, a seed layer may be formed which serves foundation used to form conductors in a layered structure so that at least part thereof overlaps conductors having a surface layer portion that is exposed due to removal of the inorganic members (step C), and whether or not surfaces of the exposed conductors and a surface of resin surrounding the conductors are on the same plane may be evaluated by measuring a surface profile of the seed layer (step D).

INDUSTRIAL APPLICABILITY

The invention is widely applicable to a method of processing a wiring substrate. A wiring substrate manufactured by a method of processing a wiring substrate according to the invention is preferably used for a wiring substrate that requires for high-density wiring.

DESCRIPTION OF REFERENCE NUMERALS

10 . . . copper clad laminate, 11 . . . first interlayer insulating film, 12 . . . seed layer, 13, 13p . . . dry film resist, 14, 14p, 14p1, 14p2 . . . Cu coating, 15 . . . second interlayer insulating film, 22 . . . second seed layer.

What is claimed is:

1. A method of processing a wiring substrate that includes a configuration in which conductors locally disposed on a substrate are coated with resin having inorganic members that form a filler and are dispersed in an organic member and in which the conductors have surface layer portions, the method comprising:

removing only the organic member from a surface layer side of the resin by use of an ashing method until the surface layer portions of the conductors are observed; and removing, by use of a wet cleaning method, the inorganic members remaining the surface layer side of the resin from which the organic member is removed, such that surfaces of the surface layer portions of the conductors which are exposed due to the removal of the inorganic members and a surface of the resin surrounding the conductors are on the same plane.

2. The method of processing a wiring substrate according to claim 1, wherein removal of the organic member from the surface layer side of the resin is repeatedly carried out via the resin located at a position at which the conductors are covered therewith until the surface layer portions of the conductors are observed.

3. The method of processing a wiring substrate according to claim 1, wherein an ashing method used in removal of the organic member from the surface layer side of the resin is carried out while applying high-frequency power to the substrate, and a bias RF output (W) of the high-frequency power is 0 to 1500.

4. The method of processing a wiring substrate according to claim 1, wherein an ashing method used in removal of the organic member from the surface layer side of the resin is carried out while applying high-frequency power to the substrate, and a bias RF output density (W/cm$^2$) of the high-frequency power is 0.2 to 0.8.

5. The method of processing a wiring substrate according to claim 1, wherein an ashing method used in removal of the organic member from the surface layer side of the resin uses, as a processing gas, a mixed gas containing a gas selected from the group consisting of oxygen ($O_2$), nitrogen ($N_2$), and carbon tetrafluoride ($CF_4$).

6. The method of processing a wiring substrate according to claim 1, wherein a seed layer is formed which serves foundation used to form conductors in a layered structure so that at least part thereof overlaps the conductors having a surface layer portions that are exposed due to removal of the inorganic members, and whether or not surfaces of the exposed conductors and a surface of resin surrounding the conductors are on a same plane is evaluated by measuring a surface profile of the seed layer.

* * * * *